(12) United States Patent
Kim et al.

(10) Patent No.: US 7,623,375 B2
(45) Date of Patent: Nov. 24, 2009

(54) METHOD OF OPERATING A FLASH MEMORY DEVICE

(75) Inventors: You Sung Kim, Seoul (KR); Ji Hye Son, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 6 days.

(21) Appl. No.: 11/966,014

(22) Filed: Dec. 28, 2007

(65) Prior Publication Data

US 2008/0212367 A1 Sep. 4, 2008

(30) Foreign Application Priority Data

Jan. 23, 2007 (KR) ........................ 10-2007-0007049

(51) Int. Cl.
*G11C 11/34* (2006.01)
(52) U.S. Cl. .............................. 365/185.03; 365/185.24
(58) Field of Classification Search ............ 365/185.03, 365/185.24
See application file for complete search history.

(56) References Cited

U.S. PATENT DOCUMENTS

| | | | |
|---|---|---|---|
| 5,907,561 A * | 5/1999 | Blish et al. ................. | 714/718 |
| 6,333,889 B1 * | 12/2001 | Arimoto ................. | 365/230.03 |
| 6,791,877 B2 | 9/2004 | Miura et al. | |
| 6,906,961 B2 | 6/2005 | Eggleston et al. | |
| 6,952,368 B2 | 10/2005 | Miura et al. | |
| 6,977,847 B2 | 12/2005 | Lasser et al. | |
| 7,016,226 B2 | 3/2006 | Shibata et al. | |
| 7,068,562 B2 | 6/2006 | Miura et al. | |
| 2005/0254329 A1 * | 11/2005 | Yamashita et al. ...... | 365/230.03 |
| 2008/0055995 A1 * | 3/2008 | Ito ......................... | 365/185.18 |

* cited by examiner

Primary Examiner—Michael T Tran
(74) Attorney, Agent, or Firm—Townsend and Townsend and Crew LLP

(57) ABSTRACT

In a method of operating a flash memory device including a memory cell array having a Multi-Level Cell (MLC) for storing plural bit data, a first memory block included in the MLC is selected. First to $M^{th}$ word lines are selected while increasing from a first column line to an $N^{th}$ column line, which are included in the first memory block. A lower page of each word line is selected in the order of the word lines. The first to $M^{th}$ word lines are selected while increasing from the first column line to the $N^{th}$ column line. An upper page of each word line is selected in the order of the word lines.

6 Claims, 3 Drawing Sheets

FIG. 1A

| | BLo | BLe | BLo | BLe | | BLo | BLe | BLo | BLe |
|---|---|---|---|---|---|---|---|---|---|
| WL<M> | N th page | N th page | N th page | N th page | ⋮ | N th page | N th page | N th page | N th page |
| | ⋯ | ⋯ | ⋯ | ⋯ | | ⋯ | ⋯ | ⋯ | ⋯ |
| | Second page | Second page | Second page | Second page | | Second page | Second page | Second page | Second page |
| | First page | First page | First page | First page | | First page | First page | First page | First page |
| ⋯ | | | | | ⋰ | | | | |
| WL<2> | N th page | N th page | N th page | N th page | ⋮ | N th page | N th page | N th page | N th page |
| | ⋯ | ⋯ | ⋯ | ⋯ | | ⋯ | ⋯ | ⋯ | ⋯ |
| | Second page | Second page | Second page | Second page | | Second page | Second page | Second page | Second page |
| | First page | First page | First page | First page | | First page | First page | First page | First page |
| WL<1> | Second page | Second page | Second page | Second page | | Second page | Second page | Second page | Second page |
| | First page | First page | First page | First page | | First page | First page | First page | First page |

| | BLo | BLe | BLo | BLe | BLo | BLe | BLo | BLe | BLo | BLe | |
|---|---|---|---|---|---|---|---|---|---|---|---|
| | S(151) | S(156) | S(152) | S(157) | S(153) | S(158) | S(154) | S(159) | S(155) | S(160) | third page |
| | S(141) | S(146) | S(142) | S(147) | S(143) | S(148) | S(144) | S(149) | S(145) | S(150) | second page |
| WL<2> | S(131) | S(136) | S(132) | S(137) | S(133) | S(138) | S(134) | S(139) | S(135) | S(140) | first page |
| | S(121) | S(126) | S(122) | S(127) | S(123) | S(128) | S(124) | S(129) | S(125) | S(130) | third page |
| WL<1> | S(111) | S(116) | S(112) | S(117) | S(113) | S(118) | S(114) | S(119) | S(115) | S(120) | second page |
| | S(101) | S(106) | S(102) | S(107) | S(103) | S(108) | S(104) | S(109) | S(105) | S(110) | first page |
| | Col<1> | | Col<2> | | Col<3> | | Col<4> | | Col<5> | | |

| | BLo | BLe | BLo | BLe | BLo | BLe | BLo | BLe | BLo | BLe | |
|---|---|---|---|---|---|---|---|---|---|---|---|
| | S(241) | S(256) | S(242) | S(257) | S(243) | S(258) | S(244) | S(259) | S(245) | S(260) | third page |
| | S(236) | S(251) | S(237) | S(252) | S(238) | S(253) | S(239) | S(254) | S(240) | S(255) | second page |
| WL<2> | S(231) | S(246) | S(232) | S(247) | S(233) | S(248) | S(234) | S(249) | S(235) | S(250) | first page |
| | S(211) | S(226) | S(212) | S(227) | S(213) | S(228) | S(214) | S(229) | S(215) | S(230) | third page |
| WL<1> | S(206) | S(221) | S(207) | S(222) | S(208) | S(223) | S(209) | S(224) | S(210) | S(225) | second page |
| | S(201) | S(216) | S(202) | S(217) | S(203) | S(218) | S(204) | S(219) | S(205) | S(220) | first page |
| | Col<1> | | Col<2> | | Col<3> | | Col<4> | | Col<5> | | |

| | BLo | BLe | BLo | BLe | BLo | BLe | BLo | BLe | BLo | BLe | |
|---|---|---|---|---|---|---|---|---|---|---|---|
| | S(351) | S(356) | S(352) | S(357) | S(353) | S(358) | S(354) | S(359) | S(355) | S(360) | third page |
| WL<2> | S(341) | S(346) | S(342) | S(347) | S(343) | S(348) | S(344) | S(349) | S(345) | S(350) | second page |
| | S(321) | S(326) | S(322) | S(327) | S(323) | S(328) | S(324) | S(329) | S(325) | S(330) | first page |
| | S(331) | S(336) | S(331) | S(337) | S(333) | S(338) | S(334) | S(339) | S(335) | S(340) | third page |
| WL<1> | S(311) | S(316) | S(312) | S(317) | S(313) | S(318) | S(314) | S(319) | S(315) | S(320) | second page |
| | S(301) | S(306) | S(302) | S(307) | S(33) | S(308) | S(304) | S(309) | S(305) | S(310) | first page |
| | Col<1> | | Col<2> | | Col<3> | | Col<4> | | Col<5> | | |

| | BLo | BLe | BLo | BLe | BLo | BLe | BLo | BLe | BLo | BLe | |
|---|---|---|---|---|---|---|---|---|---|---|---|
| | S(451) | S(456) | S(452) | S(457) | S(453) | S(458) | S(454) | S(459) | S(455) | S(460) | third page |
| WL<2> | S(431) | S(436) | S(432) | S(437) | S(433) | S(438) | S(434) | S(439) | S(435) | S(440) | second page |
| | S(411) | S(416) | S(412) | S(417) | S(413) | S(418) | S(414) | S(419) | S(415) | S(420) | first page |
| | S(441) | S(446) | S(442) | S(447) | S(443) | S(448) | S(444) | S(449) | S(445) | S(450) | third page |
| WL<1> | S(421) | S(426) | S(422) | S(427) | S(423) | S(428) | S(424) | S(429) | S(425) | S(430) | second page |
| | S(401) | S(406) | S(402) | S(407) | S(403) | S(408) | S(404) | S(409) | S(405) | S(410) | first page |
| | Col<1> | | Col<2> | | Col<3> | | Col<4> | | Col<5> | | |

101

METHOD OF OPERATING A FLASH MEMORY DEVICE

CROSS-REFERENCES TO RELATED APPLICATIONS

The present application claims priority to Korean patent application number 2007-7049, filed on Jan. 23, 2007, which is incorporated by reference in its entirety.

BACKGROUND OF THE INVENTION

The present invention relates to address scheduling of a flash memory device and, more particularly, to a method of operating a flash memory device including Multi-Level Cells (MLCs) capable of storing a plurality of data bits.

Flash memory is generally classified into NAND type flash memory and NOR type flash memory. NOR type flash memory has a structure in which memory cells are independently connected to bit lines and word lines and, therefore, exhibits a good random access time characteristic. NAND type flash memory requires only one contact per cell string since a plurality of memory cells are connected and therefore exhibits excellent integration degree characteristics. Accordingly, the NAND structure has generally been used for highly-integrated flash memory.

In recent years, in order to further increase the integration degree of the flash memory, a multi-bit cell has been developed that can store a plurality of data in one memory cell. This type of memory cell is generally referred to as a Multi level Cell (MLC). A memory cell that stores a single bit of data is referred to as a Single Level Cell (SLC).

In general, when N bits can be stored, an MLC has N threshold voltage distributions. An MLC includes N pages to perform a program on each bit with respect to one word line. In the MLC, a program or read operation is performed on the N pages. In other words, in a flash memory device including an MLC capable of storing N-bit data, a program or read operation is performed by dividing the threshold voltage ($V^{th}$) based on a page in order to represent N bits.

In general, in N-bit flash memory devices, to implement grey code and reduce interference, the program or read operation is performed by allocating a page, having a wide cell threshold voltage variation, to a lower position.

When storing N-bit data in a cell of MLC flash memory, interference in which the threshold voltage of adjacent cells is changed due to coupling between the adjacent cells is proportional to a variation in the cell threshold voltage.

Accordingly, to program data into a MLC flash memory device and read data programmed into a MLC flash memory device, a variety of methods for minimizing interference are employed.

SUMMARY OF THE INVENTION

The present invention is directed towards a method of operating a flash memory device, which minimizes interference between memory cells of a flash memory device including MLCs.

In an aspect of the present invention, there is provided a method of operating a flash memory device including a plurality of memory blocks having a plurality of memory cells, wherein each of the plurality of memory cells includes first to $N^{th}$ column lines and first to $M^{th}$ word lines, each column line includes even and odd bit lines, and each word line includes L pages. According to the method, the memory cells to be operated are selected by sequentially selecting the first to $M^{th}$ word lines, wherein after an even bit line of a first page of each selected word line is selected, the column lines are sequentially increased from a first column line to an $N^{th}$ column line, and after an odd bit line of the first page of the selected word line is selected, the column lines are sequentially increased from the first column line to the $N^{th}$ column line. The memory cells to be operated are selected by sequentially selecting the first to $M^{th}$ word lines, wherein after an even bit line of a second page of each selected word line is selected, the column lines are sequentially increased from the first column line to the $N^{th}$ column line, and after an odd bit line of the second page of the selected word line is selected, the column lines are sequentially increased from the first column line to the $N^{th}$ column line. The memory cells to be operated are selected by sequentially selecting first to $M^{th}$ word lines, wherein after an even bit line of an L page of each selected word line is selected, the column lines are sequentially increased from the first column line to the $N^{th}$ column line, and after an odd bit line of the L page of the selected word line is selected, the column lines are sequentially increased from the first column line to the $N^{th}$ column line.

The selection of the memory cells may be performed in the order of the memory blocks. A program operation may be performed in the order of the selected memory cells.

In another aspect of the present invention, there is provided a method of operating a flash memory device including a memory cell array having a Multi-Level Cell (MLC) capable of storing a plurality of bit data, including selecting a first memory block included in the MLC, selecting first to $M^{th}$ word lines while increasing from a first column line to an $N^{th}$ column line, which are included in the first memory block, wherein a lower page of each word line is selected in the order of the word lines, and selecting the first to $M^{th}$ word lines while increasing from the first column line to the $N^{th}$ column line, wherein an upper page of each word line is selected in the order of the word lines.

The selection of the lower page or the upper page of the word line may include selecting an even bit line while increasing from the first column line to the $N^{th}$ column line, and selecting an odd bit line while increasing from the first column line to the $N^{th}$ column line. A program operation may be performed in the order of a selected MLC.

BRIEF DESCRIPTION OF THE DRAWINGS

FIG. 1A is a block diagram of a memory cell array of a flash memory device;

FIG. 1B is a block diagram illustrating address scheduling of the flash memory device performed by a first method;

FIG. 1C is a block diagram illustrating address scheduling of the flash memory device performed by a second method;

FIG. 1D is a block diagram illustrating address scheduling of the flash memory device performed by a third method; and FIG. 1E is a block diagram illustrating address scheduling of the flash memory device according to an embodiment of the present invention.

DESCRIPTION OF SPECIFIC EMBODIMENTS

Specific embodiments according to the present invention will be described with reference to the accompanying drawings.

FIG. 1A is a block diagram of a memory cell array of a flash memory device.

Referring to FIG. 1A, a memory cell array 100 including a MLC 101 that can store N-bit data includes M word lines WL<1> to WL<M> and L column lines Col<1> to Col<L>.

Each of the word lines WL<1> to WL<M> includes N pages for storing N-bit data. Each of the column lines Col<1> to Col<L> includes two even and odd bit lines BLo and BLe. A typical NAND type flash memory device has a plurality of blocks, which is the same type of block as that of the memory cell array 100. In FIG. 1A, the memory cell array 100 includes only one memory block as an example.

Therefore, the number of the column lines is L and the number of the word lines is M. In the case of the memory cell array 100 capable of storing N-bit data, 2L*M*N programs are executed.

When programming the memory cell array 100, a memory cell is selected according to a preset address sequence, and program, verification and read operations are executed. Address scheduling is used to determine the sequence of the addresses for executing the program, verification and read operations. In other words, the program, verification and read operations of the flash memory device are controlled according to the sequence of the addresses, which is set based on address scheduling.

A variety of address scheduling methods have been developed. To describe the different address scheduling methods, it is assumed that in FIGS. 1B to D, the column line includes a memory cell 101 that can store 3-bit (N=3) data, and the memory cell array 100 includes five column lines (L=5) and two word lines (M=2).

FIG. 1B is a block diagram illustrating address scheduling of the flash memory device performed by a first method.

In the address scheduling performed by the first method, scheduling is performed in the order of: the column line-the bit line-the page of the MLC-the word line-the block. If a program is executed according to the scheduling method, the block of the memory cell array 100 is selected, and then the word line, the bit line, the page of the MLC and the column line are selected sequentially.

It is assumed that the memory cell array 100 for describing an embodiment of the present invention includes one memory block. Thus, in the address scheduling sequence illustrated in FIG. 1B, after the memory block is selected, the first word line WL<1> is selected. After a first page is selected and the odd bit line BLo is selected, the program sequence is decided while changing the column lines Col<1> to Col<5> in steps S101 to S105.

After the column lines Col<1> to Col<5> are changed, the odd bit line BLo changes to the even bit line BLe and the program sequence is then decided in steps S106 to S110. The first page changes to a second page, and the bit lines BLo, BLe and the column lines Col<1> to Col<5> are changed in steps S101 to S110. The program sequence is then decided in steps S111 to S120.

If the program sequence for the first word line WL<1> is decided, the same program sequence is performed on the second word line WL<2> in steps S131 to S160.

In the second method similar to the first method, an order of deciding the address is changed as follows.

FIG. 1C is a block diagram illustrating address scheduling of the flash memory device performed by a second method.

Referring to FIG. 1C, in the address scheduling performed by the second method, the address is changed in the order of: the column line-the page of the MLC-the bit line-the word line-the block.

If a program is executed according to the scheduling method, the block of the memory cell array 100 is selected, the word line is selected, the page of the MLC is selected, the bit line is selected, and the column line is then selected.

Accordingly, in the address scheduling sequence shown in FIG. 1C, after the memory block is selected, the first word line WL<1> is selected. After the odd bit line BLo and the first page are selected, the program sequence is decided while changing the column lines Col<1> to Col<5> in steps S201 to S205.

After the column lines Col<1> to Col<5> are changed, the first page changes to a second page and the program sequence is decided in steps S206 to S210. The second page changes to a third page and the program sequence is decided in steps S210 to S215.

After the pages of the first word line WL<1> are changed, the odd bit line BLo changes to the even bit line BLe, and the program sequence is decided in steps S215 to S230 as in the steps S201 to S215.

If the program sequence with respect to the first word line WL<1> is decided, the same program sequence is decided with respect to the second word line WL<2> in steps S231 to S260.

In the address scheduling performed according to the first and second methods as illustrated in FIGS. 1B and 1C, the address is scheduled so that pages associated with word lines are programmed and a next word line is programmed. Accordingly, the threshold voltage of the cell changes to the greatest value, so that it may be vulnerable to interference.

To solve this problem, the following third method can be applied.

FIG. 1D is a block diagram illustrating address scheduling of the flash memory device performed by a third method.

Referring to FIG. 1D, in the address scheduling according to the third method, after a lower page program is performed on an adjacent cell, a corresponding cell program is executed. In this address scheduling method, a combination of the first and second methods is performed.

The first page of the odd bit line BLo of the first word line WL<1> is first programmed for column lines Col<1> to Col<5> and the first page of the even bit line BLe is programmed for column lines Col<1> to Col<5> in steps S301 to S310. A program is then executed on the second page in the same manner as the first word line WL<1> in steps S311 to S320.

Thereafter, after the word line is changed, the first page of the odd bit line BLo of the second word line WL<2> is programmed for column lines Col<1> to Col<5> and the first page of the even bit line BLe is programmed for column lines Col<1> to Col<5> in steps S321 to S330. A third page of the first word line WL<1> is programmed for column lines Col<1> to Col<5> by alternately selecting the odd/even bit lines BLo and BLe in steps S331 to S340.

The second and third pages of the second word line WL<2> are then programmed according to the same priority described in steps S341 to S360.

If the address is scheduled so that a program is executed according to the third method, interference can be minimized in the bit line direction, but implementation is difficult. Further, since the state of a page programmed on a word line basis is different, a flag cell to indicate a program state is required.

Thus, the present invention presents the following method.

FIG. 1E is a block diagram illustrating the address scheduling method of the flash memory device according to an embodiment of the present invention.

FIG. 1E illustrates an address scheduling sequence using the memory cell array 100 illustrated in FIGS. 1B to 1D as an example.

Referring to FIG. 1E, in the address scheduling method according to an embodiment of the present invention, the address sequence is scheduled in the order of: the column line-the bit line-the word line-the page of the MLC-block. In other words, lower pages of the word lines within a corresponding block are programmed first. After all selected pages are programmed, word lines and bit lines of a next page are changed, a column line is changed and a program is then performed.

More specifically, after the block of the memory cell array 100 is selected, a first page is selected. The first word line WL<1> is then selected and the odd bit line BLo is selected. The column lines Col<1> to Col<5> are changed and the program sequence is decided in steps S401 to S405.

After the column lines Col<1> to Col<5> are changed and the program sequence is decided, the odd bit line BLo is changed to the even bit line BLe and the program sequence is decided in steps S406 to S410.

Thereafter, the word line is changed and the second word line WL<2> is selected, so that the program sequence is decided according to the same sequence as that of steps S401 to S410 in steps S411 to S420.

If the program sequence with respect to the first page is decided according to the steps S401 to S420, the program sequence with respect to a second page is decided according to the same sequence in steps S421 to S440. The program sequence with respect to a third page is also decided in steps S441 to S460.

In the above address scheduling method, when the same page, for example, the first pages of the word lines, are programmed and the word lines with respect to the second page are then performed as described above, the shift in the threshold voltage value of a cell decreases as the sequence of the page rises.

Therefore, if the cells are programmed with respect to the first page and the pages with respect to the second page are programmed, the amount of interference when programming the second page becomes smaller than that when the first page is programmed. Thus, since the shift in the threshold voltage of the cell reduces as the sequence of the page rises, interference between the cells is minimized.

Further, the change of the threshold voltage due to the interference in the bit line direction is offset through verification in subsequent pages, so that interference can be minimized.

As described above, according to the present invention, scheduling can be performed easily while minimizing interference between cells when programming an MLC.

Although the foregoing description has been made with reference to specific embodiments, it is to be understood that changes and modifications of the present invention may be made by one having ordinary skill in the art without departing from the spirit and scope of the present invention and appended claims.

What is claimed is:

1. A method of operating a flash memory device including a plurality of memory blocks having a plurality of memory cells, wherein each of the plurality of memory cells includes first to $N^{th}$ column lines and first to $M^{th}$ word lines, each column line includes even and odd bit lines, and each word line includes L pages, the method comprising:

selecting the memory cells to be operated by sequentially selecting the first to $M^{th}$ word lines, wherein after an even bit line of a first page of each selected word line is selected, the column lines are sequentially increased from a first column line to an $N^{th}$ column line, and after an odd bit line of the first page of the selected word line is selected, the column lines are sequentially increased from the first column line to the $N^{th}$ column line;

selecting the memory cells to be operated by sequentially selecting the first to $M^{th}$ word lines, wherein after an even bit line of a second page of each selected word line is selected, the column lines are sequentially increased from the first column line to the $N^{th}$ column line, and after an odd bit line of the second page of the selected word line is selected, the column lines are sequentially increased from the first column line to the $N^{th}$ column line; and selecting the memory cells to be operated by sequentially selecting first to $M^{th}$ word lines, wherein after an even bit line of an L page of each selected word line is selected, the column lines are sequentially increased from the first column line to the $N^{th}$ column line, and after an odd bit line of the L page of the selected word line is selected, the column lines are sequentially increased from the first column line to the $N^{th}$ column line.

2. The method of claim 1, wherein the selection of the memory cells is performed in the order of the memory blocks.

3. The method of claim 1, wherein a program operation is performed in the order of the selected memory cells.

4. A method of operating a flash memory device including a memory cell array having a Multi-Level Cell (MLC) capable of storing a plurality of data bits, the method comprising:

selecting first to $M^{th}$ word lines, each word line including a lower page and an upper page;

selecting first to $M^{th}$ lower pages included in the first to $M^{th}$ word lines in the order of the word lines; and after the first to $M^{th}$ lower pages are sequentially selected, selecting first to $M^{th}$ upper pages included in the first to $M^{th}$ word lines in the order of the word lines.

5. The method of claim 4, wherein the selection of the lower page or the upper page of the word line includes:

selecting an even bit line while increasing from a first column line to an $N^{th}$ column line; and selecting an odd bit line while increasing from the first column line to the $N^{th}$ column line.

6. The method of claim 5, wherein a program operation is performed in the order of a selected page.

* * * * *